United States Patent [19]

Weimer

[11] 4,055,836
[45] Oct. 25, 1977

[54] CHARGE TRANSFER READOUT CIRCUITS

[75] Inventor: Paul Kessler Weimer, Princeton, N.J.

[73] Assignee: RCA Corporation, New York, N.Y.

[21] Appl. No.: 718,075

[22] Filed: Aug. 26, 1976

[51] Int. Cl.² .......................... G11C 7/06; H04N 3/14
[52] U.S. Cl. ............................ 340/173 R; 307/221 D;
   307/279; 340/173 LS; 358/213
[58] Field of Search ..................... 340/173 R, 173 LS;
   235/193; 358/213; 357/24; 307/221 D, 279

[56] References Cited
U.S. PATENT DOCUMENTS

| | | | |
|---|---|---|---|
| 3,849,673 | 11/1974 | Koo | 307/235 R |
| 4,011,441 | 3/1977 | Michon et al. | 340/173 LS |

*Primary Examiner*—Stuart N. Hecker
*Attorney, Agent, or Firm*—H. Christoffersen; Samuel Cohen

[57] ABSTRACT

During readout, the signals induced on the columns of a charge transfer array cause currents to flow through respective conduction paths of field effect transistors connected to the columns. The threshold voltage $V_{th}$ of each transistor is compensated for prior to readout by establishing the gate electrode thereof at a quiescent gate bias level $V_c + V_{th}$, where $V_c$ is the quiescent voltage at the source electrode of that transistor. The effects of dark current or other fixed signal level it is desired to discriminate against associated with the respective columns of the array, also may be compensated for by reducing the quiescent bias level on the gate electrode by an amount proportional thereto.

20 Claims, 11 Drawing Figures

CHARGE TRANSFER READOUT CIRCUITS

This application deals with charge transfer arrays such as those of the charge-coupled device (CCD), charge-injection device (CID), and bucket brigade types, and particularly with readout circuits, therefor.

There is described in copending U.S. application Ser. No. 634,447, filed Nov. 24, 1975, now U.S. Pat. No. 4,016,550, for "Charge-Transfer Readout of Charge Injection Device Arrays" by the present applicant and assigned to the same assignee as the present application, various readout circuits for CID arrays. In these circuits, prior to readout excess charge is supplied to each column. Then a portion of the charge on each column is permitted to flow through a field effect transistor, connected at its source electrode to that column and connected at its drain electrode to a common drain region, while the gate electrode of that transistor is maintained at a fixed reference level $V_G$. Upon the cessation of current flow through the respective transistors, there is established on the columns a quiescent reference voltage level $V_G$-$V_{th}$, where $V_{th}$ is the threshold voltage of a transistor, thereby compensating for differences in the threshold voltage among the various readout transistors. In other words, as each column conductor is at a voltage level which is one $V_{th}$ less than the gate voltage of the readout transistor connected to that column, whatever signal is induced on the column during readout of the column, passes substantially in its entirety to the drain electrode of that transistor (and thence to a stage of a CCD readout register) regardless of the threshold voltage $V_{th}$ of that particular transistor.

In the circuits of the present application, the different threshold voltages of the readout transistors are compensated for in a different way. Rather than maintaining the gate electrodes of the readout transistors at a fixed potential, they are caused to assume a potential substantially equal to $V_c + V_{th}$, where $V_c$ is the source electrode potential. Further, in a number of embodiments of the invention, the quiescent gate potential may be reduced an amount $V_K$, where $V_K$ represents a fixed signal level it is desired to discriminate against such as one indicative of smear as an example.

Figure 1:
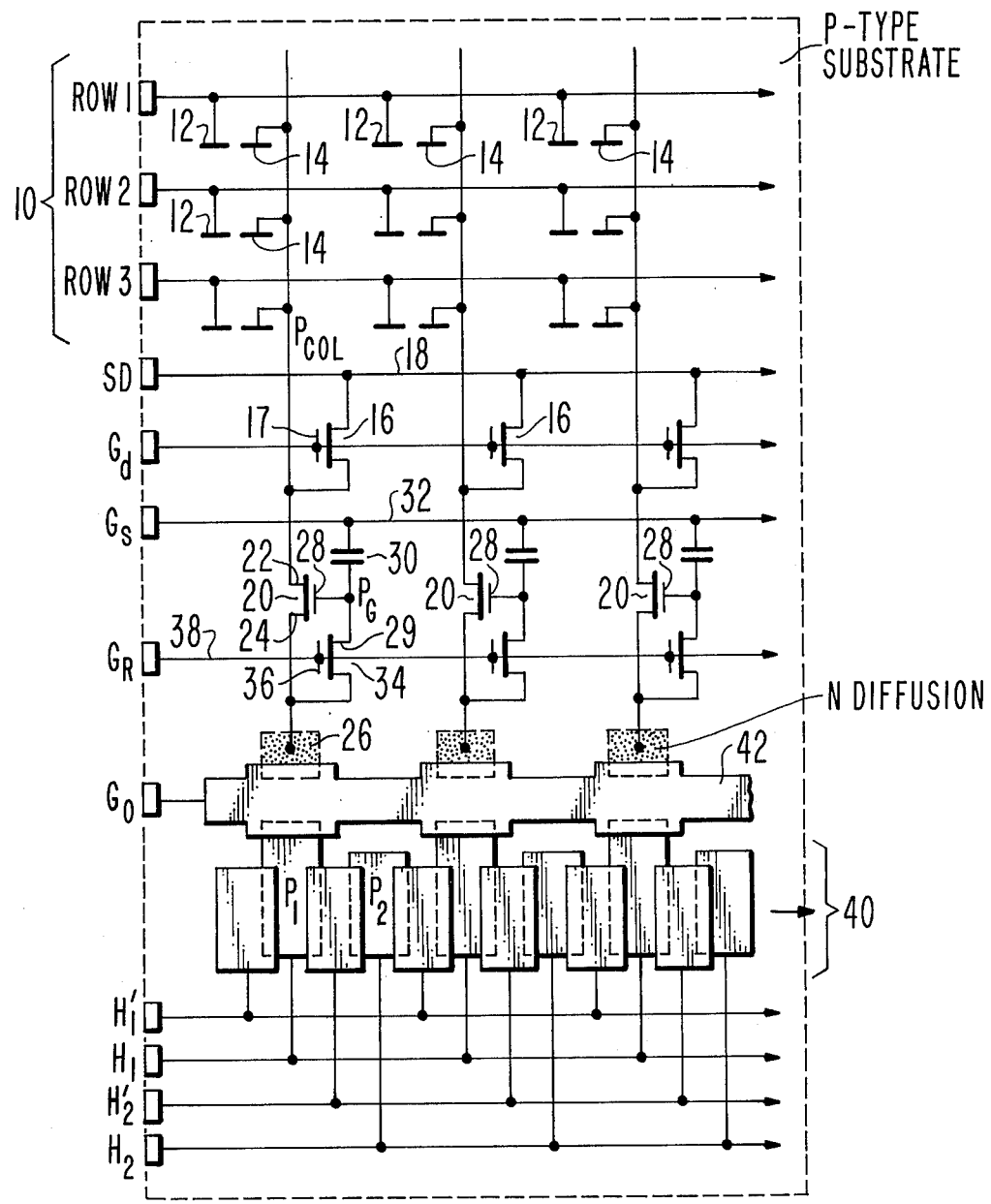
FIG. 1 is a schematic showing of a CID array, and a readout circuit therefor embodying the invention.

FIG. 1 illustrates at 10 a small portion, namely three columns and three rows, of a CID charge transfer array. It is assumed for purposes of the present discussion that the substrate is of P-type semiconductor material (the devices are N channel). Each location includes a plate 12 connected to a row conductor and a plate 14 connected to a column conductor. These plates are capacitively coupled to the substrate and there may be an N-type diffusion in the substrate between the two plates, with the adjacent edges of the two plates slightly overlapping the diffusion as illustrated and discussed in the copending application. To simplify the drawing, this diffused region is not shown.

The readout circuit for the array comprises a group of transistors and a capacitor per column. As the circuit elements are the same for each column, only those associated with one of the columns will be discussed in this and the other figures. This circuit includes a first transistor 16 connected at its gate electrode 17 to a conductor receiving a control voltage $G_d$, at its source or drain electrode to a conductor 18 and connected at its drain or source electrode to the column. The drain and source electrodes of these and the other transistors may be diffusions in the substrate of opposite conductivity to the substrate. Transistor 16 and the others may be MOS transistors of the enhancement type and, as already mentioned, they are all N-channel transistors. The readout circuit includes also a second transistor 20 which is connected at its source electrode 22 to the column and at its drain electrode 24 to an electrically floating N-type diffusion 26. The gate electrode 28 of transistor 20 is connected to node PG. This node connects also to one terminal of capacitor 30, the other terminal of which is connected to a conductor 32. Node PG connects also to one end of the conduction path of transistor 34, the other end of which connects to floating diffusion 26. The gate electrode 36 of transistor 34 connects to a conductor 38.

The output circuit of the array comprises a two-phase operated CCD register 40. Voltages $H_1$ and $H_2$ are 180° out of phase with one another; voltage $H_1'$ is in phase with $H_1$ but is somewhat lower in positive level than $H_1$; voltage $H_2'$ is in phase with $H_2$ but somewhat lower in positive level than $H_2$. The CCD register 40 may be coupled to the respective columns by gate electrode 42.

Figure 2:
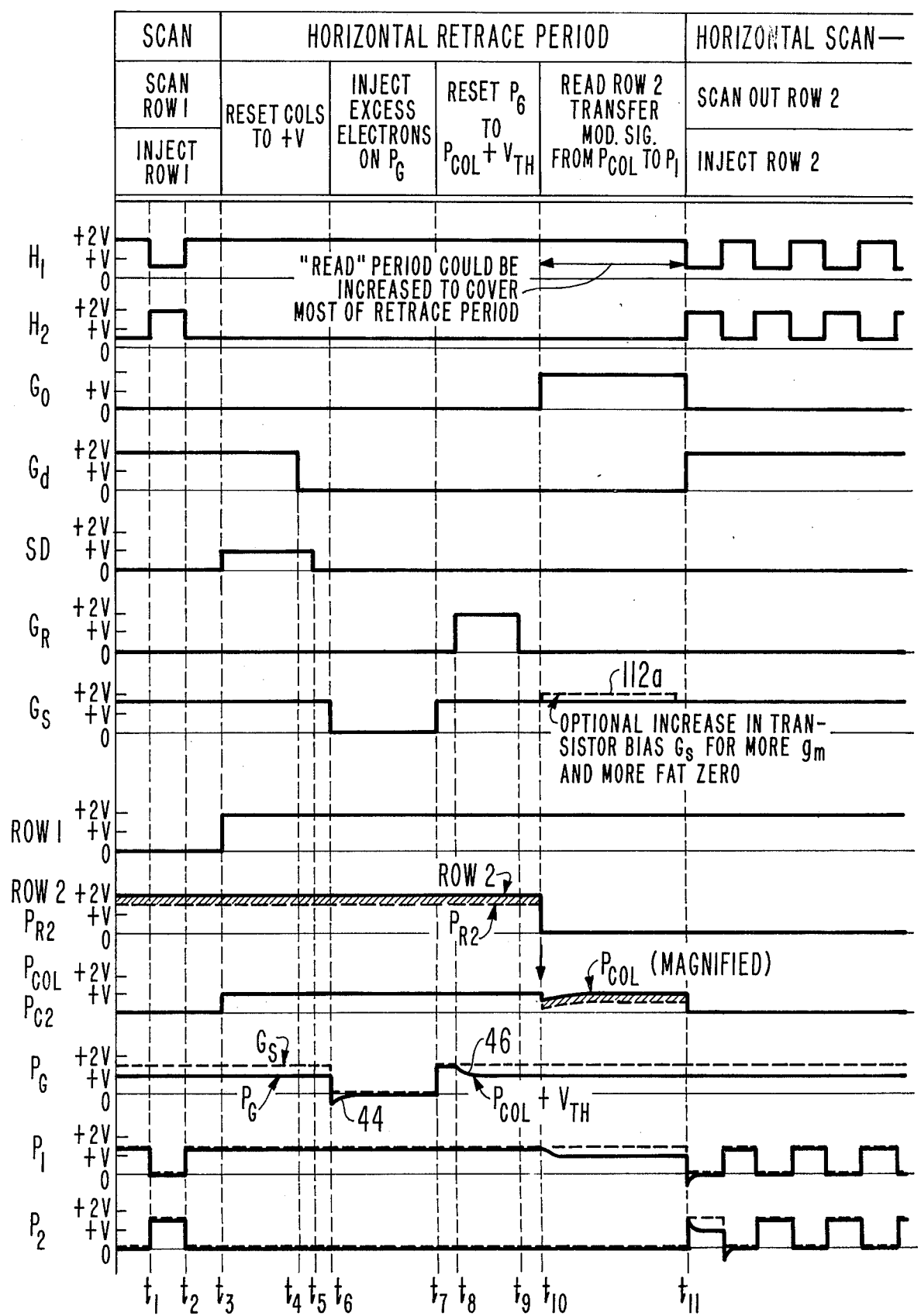
FIG. 2 is a drawing of waveforms to help explain the operation of the circuit of FIG. 1.

The operation of the system of FIG. 1 is depicted in FIG. 2. During the period $t_2$–$t_3$, row 1 is at 0 volts and the columns are all at zero volts. This means that any electrons which may be accumulated beneath electrodes 12 and which subsequently were shifted to beneath electrodes 14, have been injected into the substrate. At the same time, the electrodes 12 of row 2 are accumulating charge (indicated as the cross-hatched area $P_{R2}$). In other words, charge is being integrated in row 2. The horizontal retrace period for row 1 begins at time $t_3$. It is during this retrace period that a potential will be established at node $P_G$ which is one threshold voltage ($1V_{th}$) greater than the column potential as will be discussed in detail below.

At time $t_3$, the voltage SD changes from 0 to $+V$, where V is an arbitrary unit of voltage, such as say 5 volts. This places conductor 18 at potential $+V$. $G_d$ is at $+2V$ at this time so that the gate electrode 17 of N- channel transistor 16 has a turn-on potential applied thereto. Accordingly, transistors 16 are on and electrons are conducted from the columns through the conduction paths of these transistors to conductor 18, establishing the columns at a reference potential of +V. In the discussion which follows, only one of the columns will be referred to, it being understood that the same thing is occurring at the remaining columns.

At time $t_3$, row 1 is switched to potential +2V so that the plates 12 can begin again to accumulate charge in response to radiation excitation, the charge being stored in the depletion regions beneath these plates 12. The various columns are at a lower potential +V so that the depletion regions beneath plates 14 of row 1 are shallower than those beneath plates 12 and therefore charges will tend to accumulate almost entirely beneath plates 12 of row 1.

At time $t_4$, $G_d$ goes from +2V volts to 0 volts, turning off transistors 16. A short time later at time $t_5$, SD goes from +V to 0. The various columns therefore are now cut off from conductor 18 and are established at a reference level $V_c$ of approximately +V.

At time $t_6$, $G_S$ goes from 3V/2 to 0. Capacitor 30 instantaneously couples this change in voltage to node $P_G$. The latter may be assumed initially to be at a voltage level close to +V (actually $P_{COL}+V_{TH}$ as shown below) established during the previous horizontal retrace period and it instantaneously tends to go from this level to a negative value of −V/2. However, node $P_G$ connects to a diffusion 29 at one end of the conduction path of transistor 34. This diffusion being of N-conductivity type and being in a P-type substrate. In other words, node $P_G$ connects through a diode to the substrate, the cathode of the diode being connected to $P_G$ and the anode to the substrate. Therefore, electrons flow through this diode and are injected into the substrate, where they recombine with holes. This causes the potential at node $P_G$ to rise until it reaches approximately 0 volts as indicated by portion 44 of the waveform legended $P_G$ in FIG. 2.

At time $t_7$, $G_S$ goes from 0 volts back to its original value of 3V/2. The potential at node $P_G$ rises correspondingly. This relatively positive voltage applied to the gate electrode 28 of transistor 20, turns on transistor 20. However, there is no place for the positive charge on the column to go so it remains at substantially the same potential of about +V.

At time $t_8$, the voltage $G_R$ changes from 0 to +2V, turning on transistor 34 hard. This transistor now acts as a relatively low value of resistance and connects the gate electrode 28 to the drain electrode 24 of transistor 20. This transistor therefore now operates as a diode and electrons flow from the column, which is at potential +V, through the conduction path of transistor 34 to the gate electrode 28 of transistor 20. This flow of electrons reduces the potential of node $P_G$ from its initial value of roughly 3V/2 to a lower value as shown at portion 46 of the curve $P_G$ in FIG. 2. The electron flow away from the column slightly increases the column potential; however, as the capacitance of the column is much, much larger than that of node $P_G$, this increase in potential is extremely small and is not visible in the $P_{col}$ curve of FIG. 2. For purposes of the present discussion it can be considered the column potential remains constant. The current flow through the transistor 20 continues only so long as there is a potential differential between the gate electrode 28 and source electrode 22 which is greater than the threshold voltage $V_{th}$ of the transistor. When the gate electrode 28 potential reduces to $P_{col}+V_{th}$, conduction through transistor 20 stops and its gate electrode 28 is at the desired potential.

The same thing as just discussed occurs at each and every column. Thus, even though various transistors 20 may have different threshold potentials, each gate electrode 28 becomes established at that threshold voltage above the voltage of the column conductor.

At time $t_9$, $G_R$ goes from +2V to 0 volts, cutting off transistor 34. The potential $G_S$ at conductor 32 remains the same at its previous value of about 3V/2. Accordingly, transistor 20 now has its gate electrode disconnected from its drain electrode, and during the readout process which will follow, will operate as an ordinary MOS transistor. As already explained, the gate electrode of this transistor was established at a potential $P_{col}+V_{th}$, and as $G_S$ does not change when transistor 34 is cut off, the gate electrode 28 remains at this potential.

Time $t_{10}$ represents the end of the integration time for row 2. At this time, charge is accumulated in the depletion regions beneath plates 12 of row 2. At time $t_{10}$, the row 2 potential is changed from +2V to 0. This causes the charge (electrons) stored beneath plates 12 of row 2 to propagate to beneath plates 14 of row 2. The transfer of charge is manifested as a reduction i potential of the respective colunn conductors.

At time $t_{10}$, $G_o$, the potential applied to gate electrode 42 is changed from 0 to +2V. This creates a conduction path between floating diffusion 26 and electrode $P_1$ of the CCD register. $H_1$, the potential applied to electrode $P_1$, is at +2V so that there is a potential well beneath electrode $P_1$ which can accept charge.

When a signal is induced in the columns at time $t_{10}$ causing the columns to go relatively negative, this causes conduction through transistors 20. Recall that the gate electrodes 28 quiescently are biased at a level one $V_{th}$ greater than the quiescent reference voltage on the columns, that is, at the source electrode 22 of transistors 20. Accordingly, each column signal passes, through the conduction path of a transistor 20 to diffusion 26, through a conduction path beneath gate electrode 42, to a potential well beneath an electrode $P_1$ of the CCD output register. In other words, a row or "line" of signals is transferred, in parallel, from the CID array to register 40, and the possibly different threshold voltages $V_{th}$ of the readout transistors 20 are automatically compensated for.

At time $t_{11}$, $G_o$ goes back to zero cutting off the columns from the CCD output register. At the same time, the gate electrode 42 acts as a "channel stop" that is, it defines one edge of the CCD output register. A second channel stop, not shown, may be employed to define the other edge of the CCD output register. At the same time, the multiple phase voltages start and propagate the signals now stored in the CCD register to the output of the CCD register. These signals appear at the output circuit (not shown) of the CCD register as the sequential video signals for one line of television.

Figure 3:
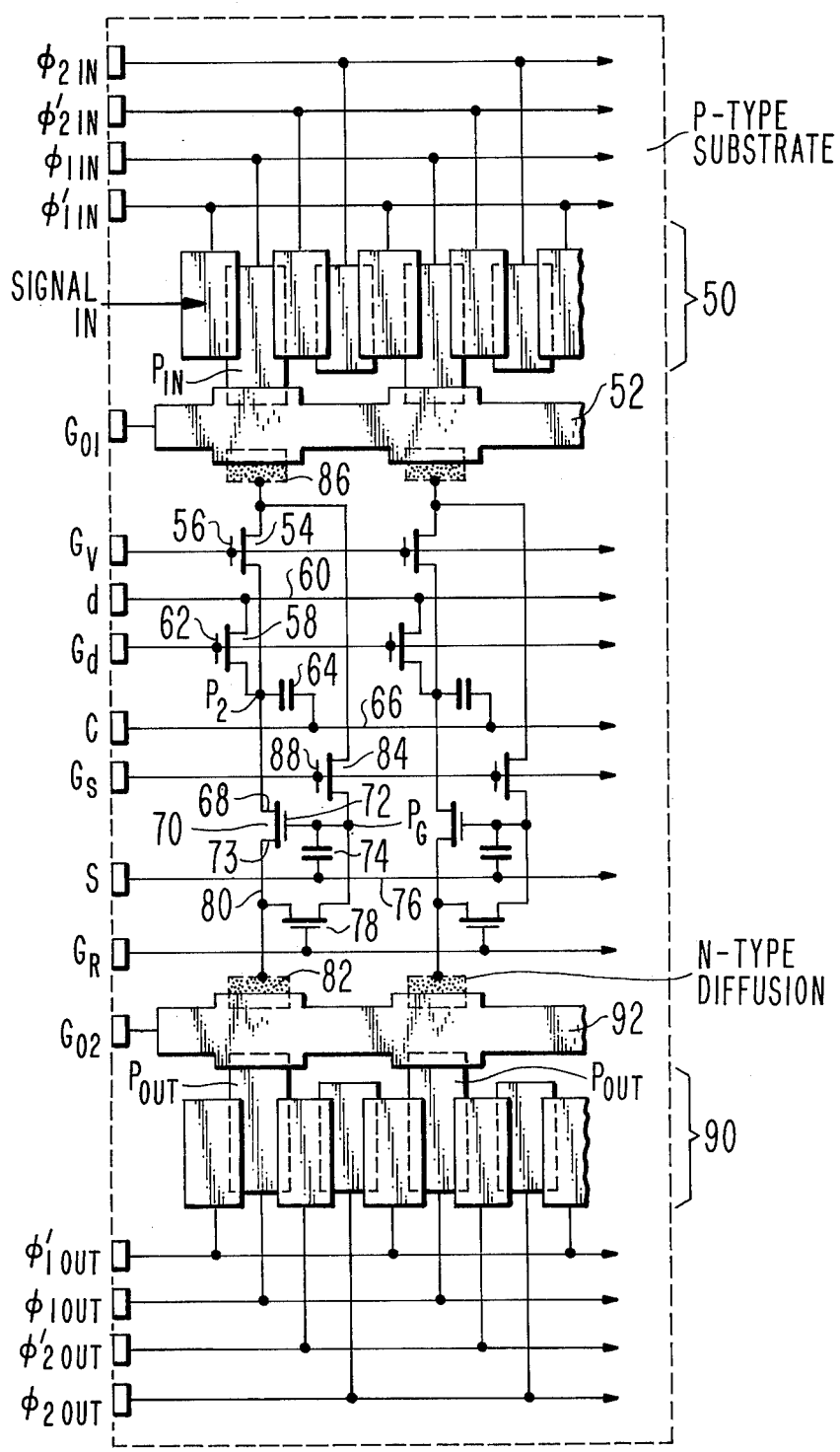
FIG. 3 is a schematic showing of how a form of the circuit of FIG. 1 can be inserted into the columns of a series-parallel-series delay line or signal processing circuit.

In the embodiment of the invention illustrated in FIG. 3, there is a CCD input register 50 rather than the CID array 10 of FIG. 1. This input register receives, during a first line time, signals indicative of some parameter of an array (not shown), such as an imaging array, against which parameter it is desired to discriminate. For example, the array may be a CCD or bucket brigade or an infrared imaging array and the first row of signals transferred to register 50 may be indicative of dark currents present along the respective columns of the array. The subsequent rows of signals may comprise a frame of information. For example 500 rows (lines) may make up a frame or 250 rows may make up one of the two interlaced fields of a frame. Each such signal will include an information component and a dark current component.

In the system illustrated in FIG. 3, the output circuit to be discussed next is quiescently biased to cancel the effects of the threshold voltages of the output transistors 70 in a manner similar to that already discussed in connection with FIG. 1. Then, an additional voltage is applied to and stored at the gate electrode of the output transistor to modify the quiescent bias to compensate for the effects of dark currents. These bias levels are generated during the vertical retrace period of a field and then they are stored for a complete field time which may be, for example, 1/60th of a second in the case of an interlaced field of commercial television.

Gate electrode 52 of FIG. 3 is for the purpose of transferring the contents of the input CCD register 50 to the output circuits. The output circuit for each "column" connected to register 50 is of the same structure. This circuit includes a first MOS transistor 54 connected at its gate electrode 56 to a terminal to which control voltage $G_v$ is applied. One end of the conduction path of this transistor is connected to a node $P_2$ of the circuit. This node connects to one end of the conduction path of MOS transistor 58, the other end of the conduction path being connected to conductor 60. The latter receives a reference voltage level $d$. The gate electrode 62 of transistor 58 is connected to a terminal which is receptive of control voltage $G_d$. Node $P_2$ also connects through capacitor 64 to a conductor 66 which is receptive of a control voltage C.

Node $P_2$ is also connected to the source electrode 68 of a third MOS transistor 70. The gate electrode 72 of this transistor connects to node $P_G$. Node $P_G$ is coupled via capacitor 75 to conductor 76, the latter receiving a control voltage S. Node $P_G$ also connects to one end of the conduction path of MOS transistor 78. The other end of the conduction path of this transistor connected to conductor 80. This column conductor also connects to an N-type diffusion 82 in the P-type substrate.

Node $P_G$ also connects to one end of the conduction path of a fourth field effect transistor 84. The other end of the conduction path of this transistor connects back to an N-type diffusion 86 and to an end of the conduction path of transistor 54. The gate electrode 88 of transistor 84 is connected to receive a control voltage $G_S$.

The signals processed by the output circuit just described are supplied at an appropriate time to the output CCD register 90 via gate electrode 92. The gate electrode 92 is controlled by a control voltage $G_{o2}$.

The input and output CCD registers are of the two-phase type. Voltages $\phi_1$ and $\phi_1'$ are in phase, with the voltage $\phi_1$ of more positive bias than the voltage $\phi_1'$ assuming a P type substrate and surface channel CCD. The voltage $\phi_2$ is 180° out of phase with the voltage $\phi_1$ and the voltage $\phi_2$ is in phase with the voltage $\phi_2'$ and of greater bias (positive) than the voltage $\phi_2'$. The input $\phi_{IN}$ and output $\phi_{OUT}$ multiple phase voltages may be separately controlled, as will become clear from the discussion.

Figure 5:
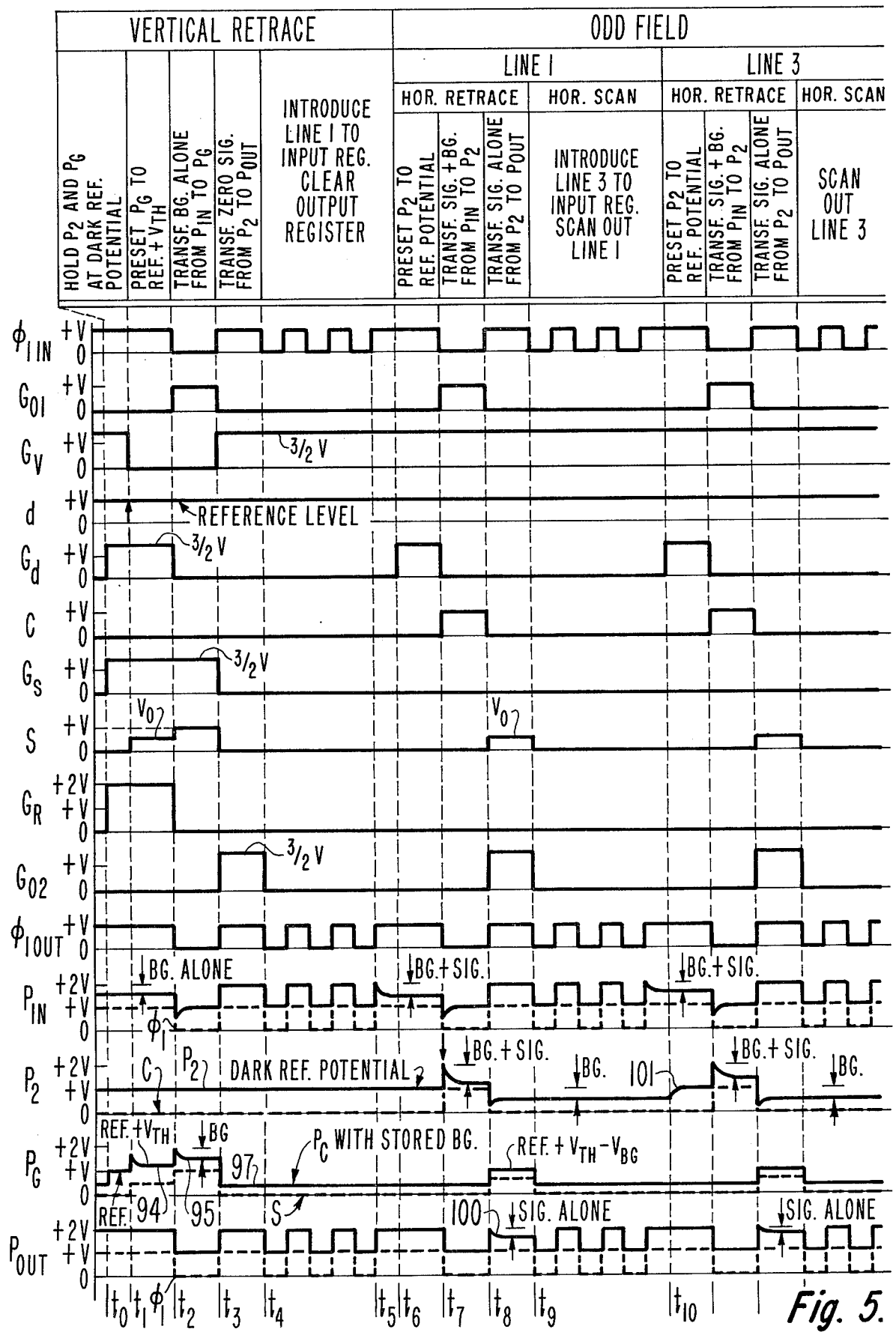
FIG. 5 is a drawing of waveforms to help explain the operation of the circuits of FIGS. 3 and 4.

In the operation of the system of FIG. 3, assume that the input register 50 initially has been loaded by serially shifting into this register signals indicative of some parameter it is desired to discriminate against. For purposes of illustration, assume that this row of signals comprises dark current signals associated with the respective columns of an imager. In FIG. 5, much signals are referred to as BG, that is, background signals.

In the explanation which follows, both FIGS. 3 and 5 should be referred to. At time $t_0$, $G_v$ is high at $+3/2V$, $G_d$ is switched high to $+3/2V$, $G_s$ is switched to $+3/2V$, and $G_r$ is switched to $+2V$. This means that transistors 54, 58, 84 and 78 are turned hard on. Conductor 60 is at a reference potential $d$ of $+V$ and consequently $P_2$ and $P_G$ are both brought to the dark reference potential $+V$. Control voltages $G_{o1}$ and $G_{o2}$ are both at zero so that the gate electrodes 52 and 92 isolated the input and output registers, respectively, from the output circuits.

At time $t_1$, $G_v$ goes low and S goes high, the latter to a value $V_o$ somewhat less than $+V$ volts. When $G_v$ goes low, this cuts off transistor 54 thereby isolating node $P_G$ from conductor 60. Recall that there previously was a path between node $P_G$ via transistors 84, 54 and 58 to this conductor 60. When S goes high, a corresponding positive voltage swing is applied to the gate electrode 72 of transistor 70 via capacitor 74. $P_G$ previously was at the reference value of $+V$ and it now goes to close to $+2V$, turning on transistor 70. The gate electrode 72 of transistor 70, which instantaneously approaches a level somewhat under $+2V$, therefore exceeds the voltage at source electrode 68 by an amount greater than $V_{th}$, the threshold voltage of transistor 70. Transistor 78 remains on as its gate electrode is connected to a positive voltage level $G_R = +2V$. As in the previous circuit, transistor 78 connected across the gate-to-drain path of transistor 70 causes transistor 70 to operate as a diode. Electrons flow from the source electrode to the drain electrode thereof and from there via the conduction path of transistor 78 to node $P_G$ until node $P_G$ assumes a voltage level one $V_{th}$ more positive than the reference voltage level at the source electrode 68 of transistor 70. Thus, just as in the previous circuit, the threshold voltage of transistor 70 has been compensated for. The placing of the node $P_G$ at the desired voltage level which, in this instance, is REF$+V_{th}$, where REF is the voltage at node $P_2$, is illustrated in FIG. 5 at 94.

At time $t_2$, $G_d$ goes low from $3/2V$ to 0. This cuts off transistor 58 and isolates node $P_2$ from conductor 60. At the same time, $G_R$ goes low from $+2V$ to 0. This cuts off transistor 78 so that the gate electrode 72 of transistor 70 is disconnected from the drain electrode 73 of this transistor. Therefore, transistor 70 is now conditioned to operate as an MOS transistor again. At the same time, $G_{o1}$ goes high to $+V$ and $\phi_{1IN}$ goes low. This causes the charge (electrons) indicative of dark current to transfer from beneath plate $P_{IN}$ to the diffusion 86. $G_S$ is high at $+3/2V$ so that transistor 84 remains on. Also at $t_2$, S is raised still more positively so that the potential at $P_G$ will be positive with respect to $G_{o1}$ during the interval $t_2-t_3$. Thus, the dark current electrons pass through the conduction path of transistor 84 to node $P_G$ and reduce the potential at this node. The previous potential at node $P_G$ during the interval $t_1-t_2$ was REF$+V_{th}$. The new potential at this node if S is reset to the same value it had during the interval $t_1-t_2$ is REF$+V_{th}-V_{BG}$, where $V_{BG}$ is a voltage indicative of dark current. Thus, the gate electrode of transistor 70 is now set to a potential which will compensate for the threshold voltage of transistor 70 and which will compensate for the dark current associated with a particular column of an imaging array from which the dark current signals initially stored in input CCD register 50 was obtained. This reduction in potential of node $P_G$ is shown at 95 in FIG. 5.

At time $t_3$, $G_{ol}$ goes low thereby again isolating the input register 50 from the circuits just discussed. At a later time, this register will receive a new row of information signals which it is desired to shift to output register 90 via the output circuits (this will be discussed later). At time $t_3$, $G_S$ goes low, thereby cutting off transistor 84. This isolates node $P_G$ from diffused region 86. Node $P_G$ will now store the charge present at this node for one complete field time, after which charge will be restored to node $P_G$.

At time $t_3$, S goes low. This negative voltage swing is coupled through capacitor 74 to the gate electrode 72 and the latter swings negative by a corresponding amount. As the voltage at 95 (FIG. 5) initially is greater than the drop in S, the voltage at 97 is above ground level, that is, there is no conduction from $P_G$ via a diode formed by a diffusion, to the substrate.

At time $t_3$, the gate electrode $G_{o2}$ goes high. This causes the transfer of any charge signal which may be present at conductor 80 and diffusion 82 to the output register. Such extraneous signal is removed from output register 90 during a later time period ($t_4-t_5$) by applying the appropriate shift voltages. Only a few cycles are illustrated in the figure.

During the time period the output register 90 is being cleared, ($t_4-t_5$) the input register 50 is receiving the first row of information signals. This can be the first line of an odd field as indicated by a legend of FIG. 5. At time $t_6$ control voltage $G_d$ goes high, turning on transistor 58 to reset node $P_2$ to the reference potential. By this time, the input register 50 has again been filled with a row of information and is storing at $P_{IN}$ a charge indicative of signal plus dark current.

At time $t_7$, $G_{ol}$ goes high to transfer the charge beneath plate $P_{IN}$ of input register 50 to diffusion 86. $G_V$ remains high so that transistor 54 is hard on and C goes high to couple a positive voltage level to the drain eletrode of transistor 54. Therefore, this charge signal which is indicative both of dark current (BG) and information (SIG) travels from $P_{IN}$ to node $P_2$.

At time $t_8$, the control signal S goes high to $+V_o$ (the same level, somewhat less than V as was present from $t_1-t_2$). This re-establishes the gate electrode 72 at the potential REF+$V_{th}$−$V_{BG}$. Therefore, transistor 70 is conditioned to conduct an amount of signal equal to the amount by which node $P_2$ potential is more negative than the dark current potential and without being affected by the threshold level of transistor 70. In other words, even though node $P_2$ receives a voltage indicative both of signal and dark current, only the portion indicative of signal will be transmitted through the conduction path of transistor 70 to conductor 80. The quiescent bias voltage at the gate electrode 72, which voltage includes a component indicative of the dark current level, will cause transistor 70 to discriminate against the dark current portion (BG) of the voltage at node $P_2$.

At time $t_8$, $G_{ol}$ goes low, turning off gate electrode 52 and isolating the input CCD register. Also, C goes low from +V to 0. This negative swing is coupled via capacitor 64 to node P;hd 2, $P_{node\ P2}$ relatively negative. At the same time $G_{o2}$ goes high, turning on gate electrode 92 and causing the transfer of signal from diffusion 82 to the region of the substrate beneath electrode $P_{OUT}$. The surface potential $P_{OUT}$ goes relatively negative as indicated at 100 in FIG. 5 and the amount by which it goes negative is indicative solely of signal. The portion of the voltage originally supplied by the input register 50, which portion was indicative of background of dark current, has been eliminated from the signal. Also, the effect of the threshold voltage of transistor 70 has been compensated.

Beginning at time $t_9$, the line of information transferred to the output register 90 is scanned out of the register, only a small number of the shift cycles being shown in the figure. The unwanted dark current which was rejected by transistor 70 remains temporarily on node $P_2$ until $P_2$ is reset to the dark potential at $t_{10}$ as shown in FIG. 5 at 101. The remainder of the operation is believed to be clear. The shifting of successive rows of information through the output circuit to the output register 90 continues for the duration of a field. Thereafter, a new charge (a new quiescent bias level) is established at node $P_G$ in the manner already discussed.

Copending U.S. application Ser. 633,689 for "Smear Reduction in CCD Imagers" filed Nov. 20, 1975 by Peter A. Levine and assigned to the same assignee as the present application, deals with the problem of smear in a CCD imager of the field transfer type. The smear charge signals are sensed during one line time of a field and subsequently in an external register and the stored signals are employed to cancel the effects of the smear charge signals on the other lines of a field. In a number of the embodiments illustrated in the copending application, the smear charge signals are recirculated and refreshed to maintain them at the desired signal levels during the field time.

Figure 4:
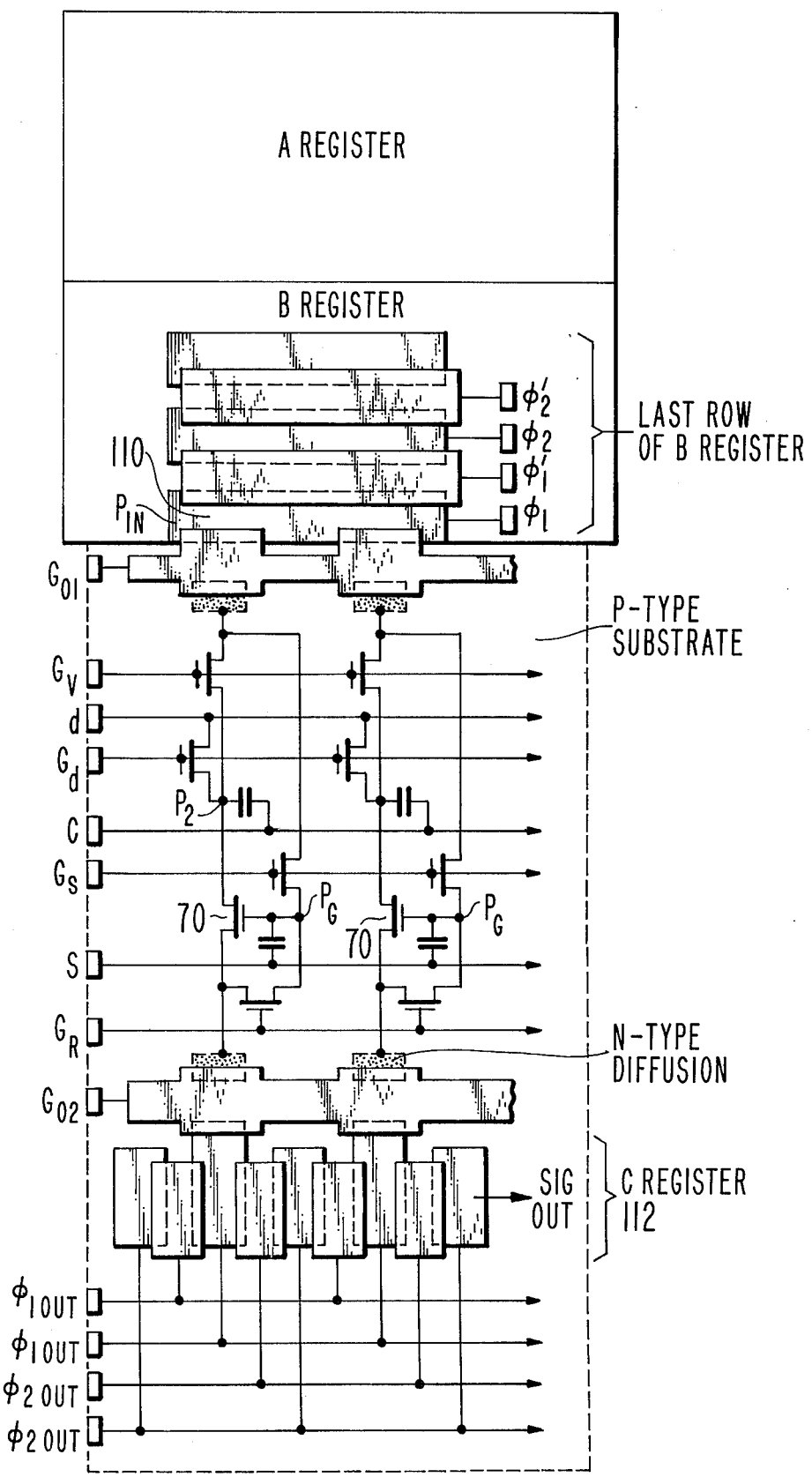
FIG. 4 is a schematic showing of a CCD charge transfer image sensor and a readout circuit therefore embodying a form of the invention.

FIG. 4 illustrates a system making use of the general principle of smear reduction discussed in the copending application but accomplishing the smear reduction without the need for an external register or recirculation of the smear charge signal. The A and B registers illustrated correspond to the A and B registers of the copending application. Using the same technique as described in the copending application, namely masking a particular row of the A register and then shifting charge signals from the A to the B register, it is possible to store in the last row of the B register a row of smear charge signals. These smear charge signals may be shifted to the region of the substrate beneath the last electrode 110 of the B register. Thereafter, the circuit may be operated in exactly the same way as discussed in connection with FIG. 3 of the present application and illustrated in FIG. 5 to store at node $P_G$ of the output circuits, a signal at a level REF+$V_{th}$−$V_{SM}$, where $V_{SM}$ is a voltage indicative of the smear charge signal level at a column. As in the case of the system of FIG. 3, the charge indicative of this voltage at node $P_G$ may be stored there for one complete field time in order to compensate the succeeding rows of information shifted out of the B register for the effects of smear and also for the effects of the threshold voltage of transistors 70.

The output register 112 of the system operates as the C register of the frame transfer CCD imager. The signals it receives which are subsequently shifted out of this register in serial fashion are the video signals for television. These video signals in the present instance automatically are compensated for the effect of smear. An important feature of the present system is its relatively simple structure and another is that recirculation of the smear signal is not required.

Figure 6:
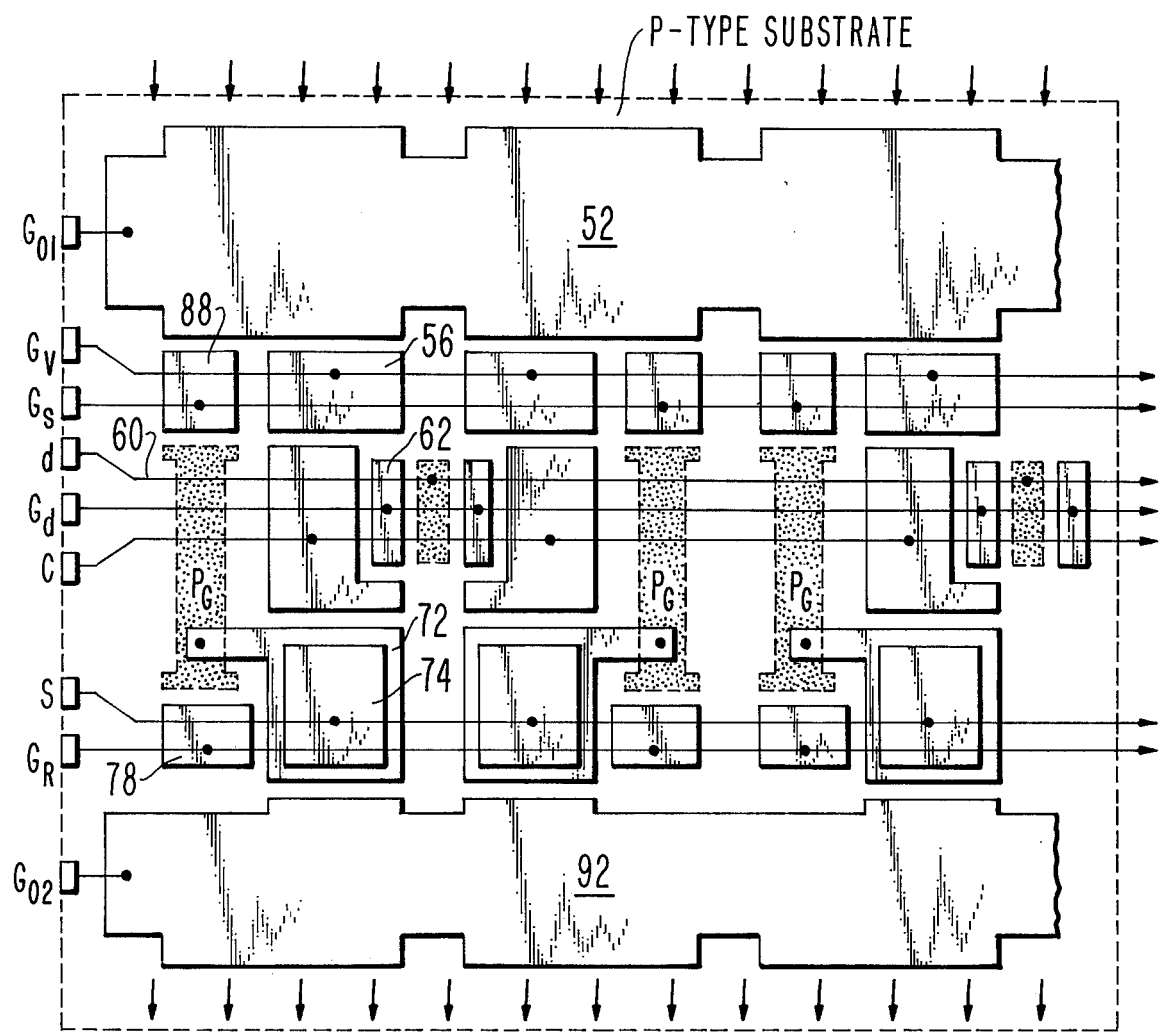
FIG. 6 is a plan view of a layout which may be employed in the readout portion of the circuits of FIGS. 3 and 4.

FIG. 6 is simply for the purpose of illustrating a suitable layout for the output circuit of FIGS. 3 and 4. The elements in FIG. 6 corresponding to those of FIG. 3 are identified by the same reference numerals. A number of the diffusions are shown as dotted regions. The remaining transistor diffusions have been omitted to show that the bucket brigade circuits of FIGS. 3 and 4 can be built as a series of charge coupled stages, if desired.

In the embodiments of the invention discussed so far, the columns of the radiation sensing array comprise conductors which are insulated from the substrate. In some applications it would be advantageous to employ instead regions of the substrate of opposite conductivity than the substrate as the column conductors. These could be elongated, narrow diffusions, for example. An advantage of such construction for certain forms of sensors is the elimination of crossovers of insulated conductors in the sensing area. A further advantage is that it makes possible the use of a sensor of the type in which the charge signal produced in response to the radiation can be transferred directly to the column conductor rather than depending upon a signal being induced on the conductor as is the case in a CID, for example. Also, the use of diffused column conductors makes it possible to operate in a mode which does not require charge injection at the radiation sensors.

While diffused column conductors do provide a number of important advantages, they also have their problems when used in a radiation sensing array which is required to generate analog signals with very low fixed-pattern noise. Each diffused column represents an extended, reverse-biased photodiode (it should be kept in mind that there is a PN junction between the diffused column and the substrate) which is subject to dc leakage and the collection of photo-charges in response to radiation. Although radiation shielding of the columns is possible, it may be difficult to provide complete radiation sheilding in a high resolution image sensing array. Each column can therefore collect a varying amount of charge depending upon the radiation it receives, the thermally generated charges it receives and so on, and this leads to vertical striations in the reproduced picture. Additional striations also may result from the collection of overflow charge from sensor elements which are illuminated at very high light levels.

Figure 7:
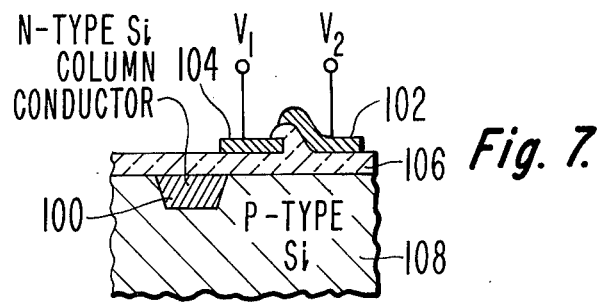
FIG. 7 is a cross section through a sensor element such as may be used in the array 109 of FIG. 8.

FIG. 7 shows one example of a radiation sensing element which employes a diffused column conductor 100. The sensor includes a storage electrode 102 and a gate electrode 104 both of which are insulated by an insulating layer 106 from the substrate 108.

In operation, during an integration time, the storage electrode 102 is held at a positive voltage level $V_2$ to produce a potential well in the substrate for the accumulation of photon-induced minority carriers (electrons). Gate electrode 104 is held at a substantially less positive potential to provide a potential barrier in the substrate. The N type diffusion 100 may be maintained at a relatively positive reference level.

At the termination of the integration time, the snesor may be read out by changing the voltage $V_2$ applied to the storage electrode 102 to a less positive value, and changing $V_1$ to a more positive value to form a conduction channel in the region of the substrate beneath electrode 104. The accumulated electrons will thereupon travel via the conduction channel to the column conductor where they can be sensed by a suitable sensing circuit to be described next.

Figure 8:
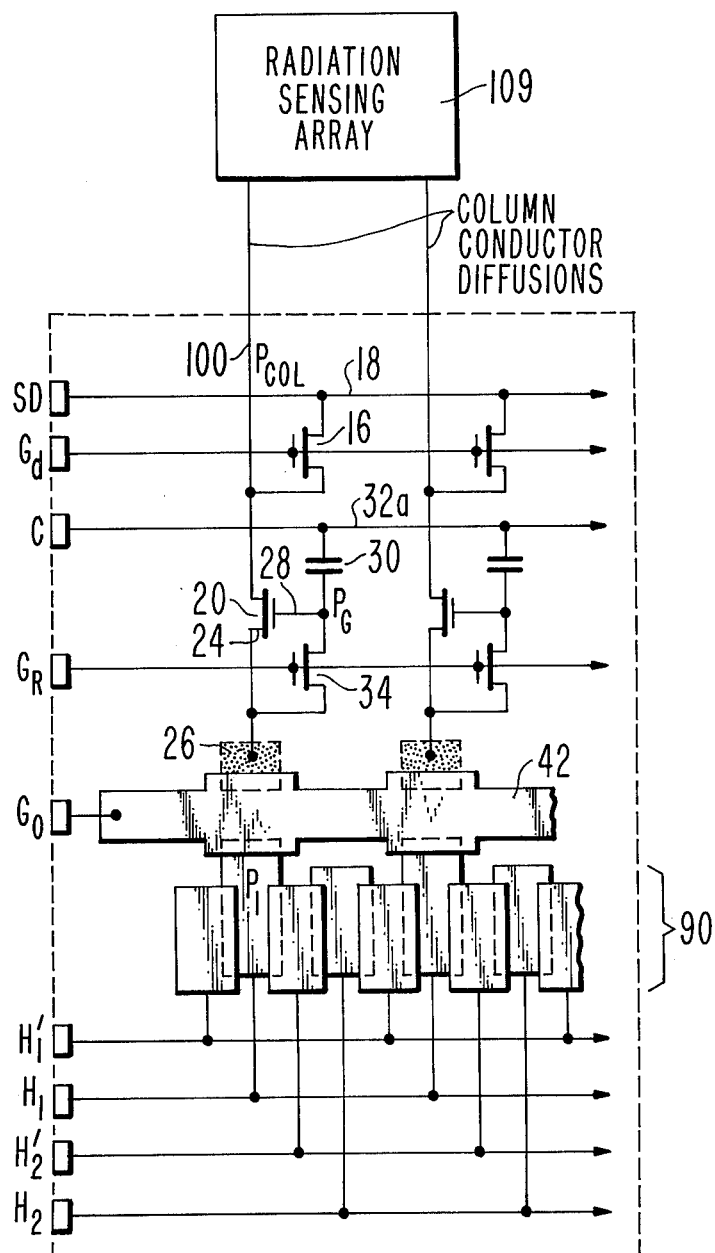
FIG. 8 is a block and schematic diagram of a radiation sensing array and readout circuits therefor.

FIG. 8 illustrates the readout circuits for two columns of the radiation sensing array 109. The column conductors are diffusions of the type shown at 100 in FIG. 7. The readout circuits are similar to the circuits of FIG. 1 and are similarly legended. However, the readout method employed, which is illustrated in FIG. 9, differs from the previous readout method.

Figure 9:
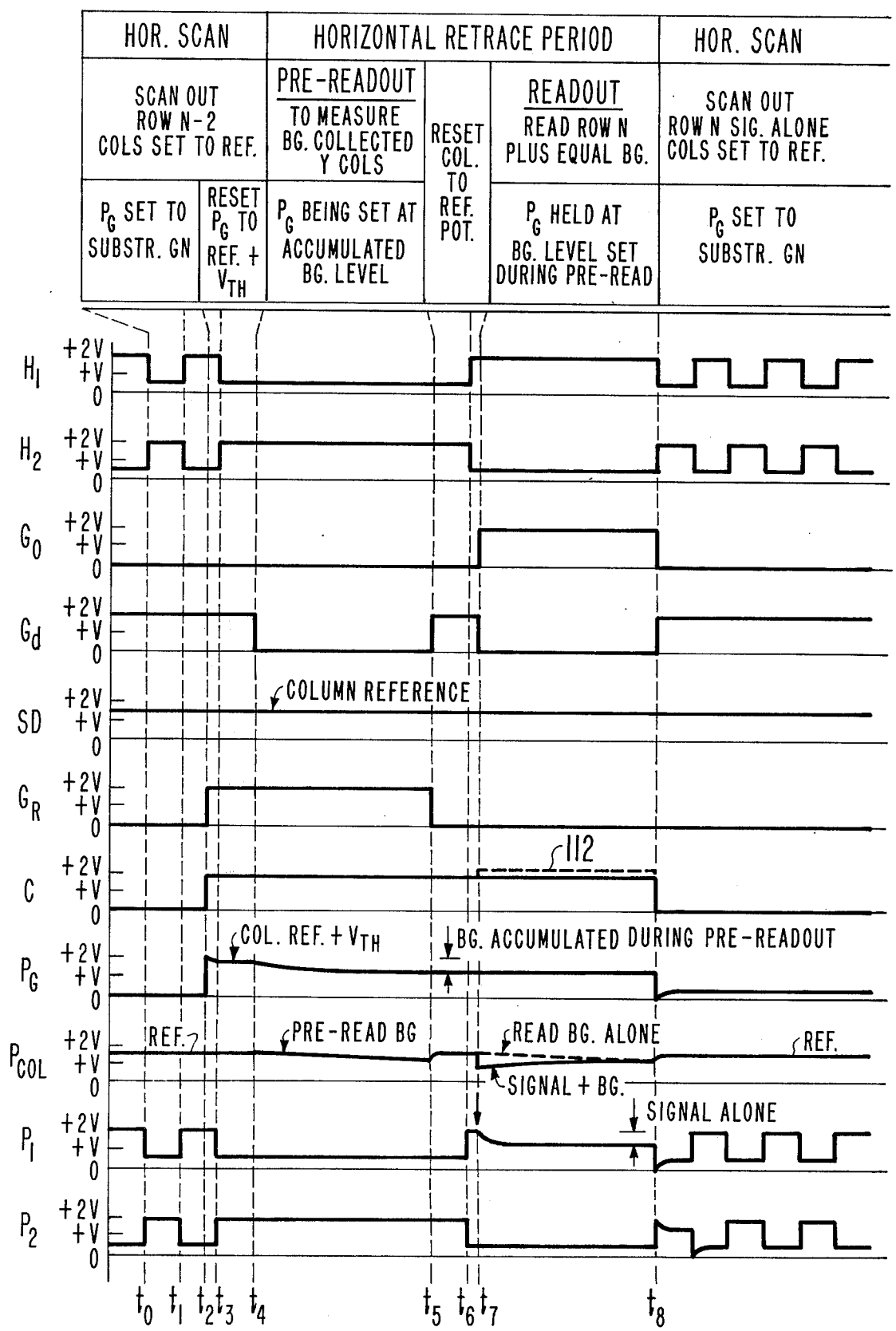
FIG. 9 is a drawing of waveforms to help explain the operation of the circuit of FIG. 8.

Referring now to FIG. 9, at the end of the horizontal scan time, that is, the time during which a previous row of information which had been present in the output register 90 was serially read out of this register, the node $P_G$ is reset to the potential $(REF)+V_{th}$, where REF is the column potential, in the manner previously discussed. During the horizontal retrace period $t_4$-$t_8$ following the horizontal scan period, first the node $P_G$ is set to a level indicative of the background current being accumulated on a column conductor such as 100, then the column is reset to the reference potential and then the column is read out.

The node $P_G$ is set to the background level during the period $t_4$-$t_5$ legended "pre-readout." Just prior to time $t_4$, node $P_G$ was at the potential $REF+V_{th}$. At time $t_4$, $G_d$ goes low turning off transistor 16 thereby disconnecting column 100 from the conductor 18, the latter conductor being at the reference voltage level of approximately 3/2V. At time $t_4$, $G_R$ is high so that transistor 34 is on. During the period $t_4$-$t_5$, background signals are generated at the colummn 100 and these signals (electrons) are conducted through the conduction path of transistor 20 and the conduction path of transistor 34 causing the gate electrode 28 of transistor 20 to follow the potential at the column conductor. Thus, the bias on transistor 20 is reduced from the value $REF+V_{th}$ to a lower value $REF+V_{th}-B_G$.

At time $t_5$, $G_R$ goes low turning off transistor 34 and thereby disconnecting the gate electrode 28 from the drain electrode 24 of transistor 20. At time $t_5$, $G_d$ goes high, turning on transistor 16. This again connects the column conductor to conductor 18 and the column conductor thereupon is again reset to the reference potential REF which is about 3/2V.

At time $t_6$, $H_1$ goes high to form a potential well beneath electrode $P_1$, which well is for the reception of charge signal from the column conductor. A short time later at time $t_7$, $G_d$ goes low cutting off transistor 16 and $G_o$ goes high causing a conduction channel to form in the substrate between the diffusion 26 at the end of the column conductor and the potential well beneath electrode $P_1$.

Readout occurs during the immediately following period $t_7$-$t_8$. During this period, a row of charges is transferred from the sensor elements to the column conductors. These charges are manifested as a decrease in potential of the column conductors. Referring to one of the columns 100, electrons flow from this column through transistor 20, through the conduction path beneath gate electrode 42 to the potential well beneath electrode $P_1$ of the CCD register. The gate electrode 28 of transistor 20 is at a potential $REF+V_{th}-B_G$. At this bias level, the effects of both the threshold of transistor 20 and the background signal present at the column are compensated for. The readout period $t_7$-$t_8$, preferably should be equal to the pre-readout period $t_4$-$t_5$ to achieve (in most cases) optimal discrimination against background signal. The assumption here is that during the period $t_7$-$t_8$ the same amount of background signal is generated as was previously generated during the period $t_4$-$t_5$ when the potential at gate electrode 28 was set. This assumption is fairly accurate.

The remainder of the operation except for the matter of constant background charge introduction, which will be discussed next, is believed to be sufficiently clear from the waveforms of FIG. 9 that additional explanation is not needed.

It is well known that the transfer efficiency of a bucket brigade charge transfer stage (such as 20 of FIG. 8) can be improved by including a constant background charge which is transferred along with each signal packet. The usefulness of adding a constant background charge stems from the fact that the conductance of a source-follower transistor approaches zero as its source electrode potential approaches closer and closer to the gate threshold potential. A constant background charge tends to keep the operating level of the source electrode somewhat below the gate threshold potential at all times, thereby improving transistor conductance and transfer efficiency. The problem of transfer efficiency and the possible need for a background charge is particularly important in the source-follower transistor which discharges the column that is, the readout transistor, such as 20, because of the relatively high capacitance of the column buses.

The description of the operation given so far has assumed that to a first approximation, the source electrode of the discharge transistor is allowed to approach very close to the threshold potential of the gate electrode in the time allotted for discharge of the column. This assumption becomes less accurate as the column capacitance increases and as the discharge (that is, the readout) period is shortened. Accordingly, it becomes desirable when the array becomes sufficiently large and/or when the readout period available is relatively short, to operate in a mode employing a background component.

A convenient method for introducing a constant background component (sometimes termed a "fat zero") in the readout circuits of FIG. 8 is to increase the voltage on conductor 32a (voltage C) by a small amount, such as a fraction of a volt, during the readout period. This is shown by dashed line 112 in FIG. 9. (A similar effect may be obtained in the circuit of FIG. 1 by making $G_S$ more positive during the read period as indicated by dashed line 112a in FIG. 2.) In both cases this is equivalent to adding a fixed charge to each column. It may be preferable in the present device to operate in this way rather than attempting to introduce the background level directly such as by illuminating the array by a bias light level. Although the portion of the bias light which falls on the sensor elements could be used to produce a background signal in the output, the portion which falls on the photosensitive column buses would not produce a useful background signal since it would be largely removed by the subtractive circuit described. An excessive bias light might tend to give spurious striations in the output if the subtractive process were less than completely effective.

It may be observed that the simulated background charge introduced in the way described is transmitted only during the readout period when it is particularly needed to help discharge the high capacitance columns. A large "fat zero" is not essential for setting $P_G$ during the pre-read period (FIG. 9) since the capacitance of $P_G$ is two orders of magnitude smaller than the column capacitance, assuming an array of reasonable size (such as 500 × 500 elements).

In the various embodiments of the invention discussed above, a signal produced in an image sensing array is transmitted via the conduction path of one or more transistors to an output register. The transistors are compensated for their threshold voltage and in some cases for variable background and other undesired signal components. These transistors operate as signal transfer elements but they do not amplify the signal. However, there are many applications where it would be desirable to amplify the signals produced by the sensor prior to their transfer to the output register. If this is to be done, the gains of the amplifiers must be equal to avoid the generation of spurious non-uniformities in the sequential output signals.

It is well known that the curvature of the MOS load line in an enhancement type inverter tends to compensate for the square law current-voltage characteristics of the driver so that linear gain is possible. To a first approximation, the small signal voltage gain is dependent on the width-to-length ratios of the conduction paths of the driver and load transistors, provided both devices are in saturation. These characteristics of MOS inverters are made use of in the circuit of FIG. 10 to obtain linear amplification. In addition, the gate electrodes of both driver and load transistors of the inverters are preset to make uniform the input and output operating levels from one inverter to the next. This involves setting the gate electrodes to a bias level such as to compensate for the threshold voltage of the various transistors in the manner discussed in detail below.

Figure 10:
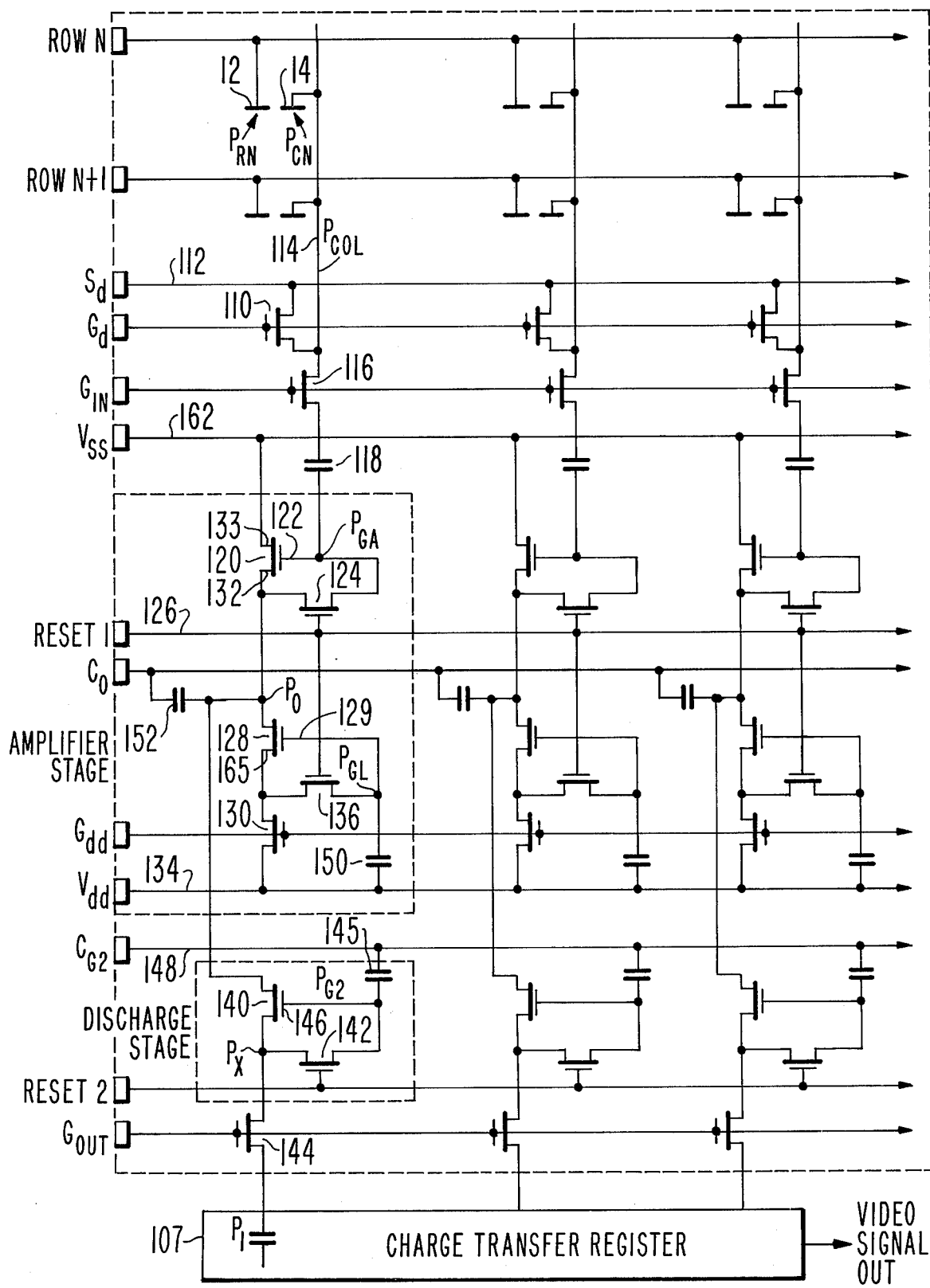
FIG. 10 is a block and schematic diagram of a CID array and readout circuits therefor, the latter including amplifiers.

FIG. 10 is illustrated in terms of the readout of a CID array. The circuit coupling a column to the charge transfer output register 107 includes transistor 110, the conduction path of which is connected between conductor 112 and the column conductor 114. The circuit also includes transistor 116, the conduction path of which connects the column 114 to one terminal of capacitor 118. The amplifier transistor is transistor 120 which is connected at its source electrode 133 to conductor 162 and at its gate electrode 122 to node $P_{GA}$ at the other terminal of capacitor 118. Transistor 124 is connected at its gate electrode to conductor 126 and the conduction path of this transistor connects the drain to the gate electrode of transistor 120. The load for the amplifier is transistor 128. Its conduction path is connected in series between the drain electrode 132 at node $P_0$ and $V_{DD}$ conductor 134 through transistor 130. This transistor 130 is a large transistor, that is, its conduction path resistance is low during conduction and, when the inverter is operative, transistor 130 is turned on hard. Therefore this transistor is considered a switch rather than as part of the load of the inverter. Transistor 136 is connected at its gate electrode to conductor 126 and the conduction path of this transistor connects the drain electrode 165 to the gate electrode 129 of transistor 128.

The discharge or readout stage of the circuit comprises transistors 140 and 142. The conductive path of transistor 140 connects node $P_0$ to one end of the conduction path of transistor 144. The other end of the conduction path of transistor 144 leads to an element illustrated shcematically as a capacitor in the charge transfer register 134. The circuit also includes capacitor 145 which connects node PG2 at the gate electrode 146 of transistor 140 to conductor 148. A second capacitor 150 connects node $P_{GL}$ to conductor 134. A third capacitor 152 connects the terminal to which control voltage $C_o$ is applied to node $P_0$.

Figure 11:
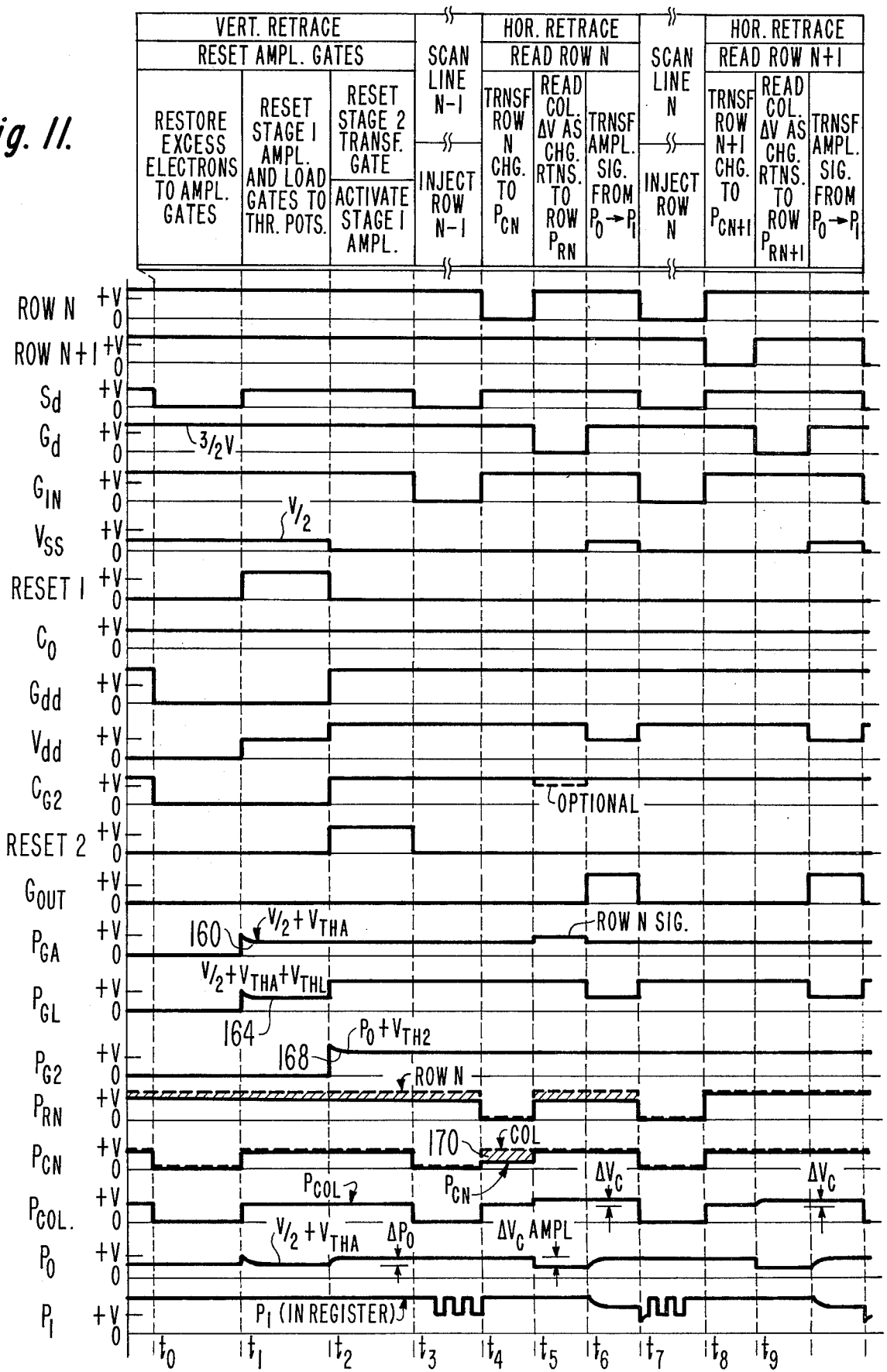
FIG. 11 is a drawing of waveforms to help explain the operation of the circuit of FIG. 10.

The operation of the circuit of FIG. 10 is illustrated in FIG. 11. At time $t_0$, $S_d$ goes low to zero volts, Gd is high at this time, so transistor 110 is on. Thus, column conductor 114 is set to close to 0 volts as indicated at $P_{COL}$ in FIG. 11. $G_{IN}$ is high at about 3/2V so that transistor 116 is on. Thus, the relatively negative voltage (actually substantially zero volts) on the column 114 is coupled to node $P_{GA}$ via capacitor 118. $P_{GL}$ is low at $t_0$ because it is capacitively coupled to the $V_{dd}$ bus 134 which is also low at this time. $C_{G2}$ is low so that node $P_{G2}$ at the gate electrode 146 of transistor 140, is low.

At time $t_1$, $S_d$ goes high to +V while transistor 110 is still on so that the column conductor 114 is established at a reference level which is close to +V volts. $G_{IN}$ remains high so that transistor 116 remains conducting. RESET 1 goes high to say almost 2V turning on transistors 124 and 136. Transistor 124 connects the gate 122 to drain 132 electrodes of transistor 120. $V_{ss}$ is high at about V/2. Capacitor 118 couples the positive voltage of close to +V on the column to the gate electrode 122 so that transistor 120 turns on. Somewhat similarly to the operation of the previous examples, transistor 120 conducts until the voltage at its drain and gate electrodes is one $V_{th}$ more positive than the voltage at its source electrode 133. The $V_{th}$ of transistor 120 is designated $V_{THA}$ in FIG. 11 where this aspect of the operation is illustrated at 160, curve $P_{GA}$. It may be observed there that the gate electrode 122 initially is at about +V. Thereafter, electrons flow from conductor 162 which is at the $V_{ss}$ level of V/2 via the conduction paths of transistors 120 and 124 to node $P_{GA}$. The conduction of electrons continues until the node voltage decreases from its initial value of about +V to $V/2+V_{THA}$.

At time $t_1$, $V_{dd}$ is at +V so that node $P_{GL}$ is also at this value and transistor 128 conducts. Electrons flow from node $P_0$ which is at a voltage level $V/2+V_{THA}$ via the conduction paths of transistors 128 and 136 to node $P_{GL}$ at the gate electrode 129 of transistor 128. This flow of electrons reduces the potential at node $P_{GL}$ until it is one $V_{th}$ greater than the potential at node $P_0$ and then conduction ceases through transistor 128. At this time the potential at node $P_{GL}$ is $V/2+V_{THA}+V_{THL}$, where $V_{THL}$ is the threshold voltage of transistor 128. This is illustrated by curve 164 in FIG. 11. $G_{dd}$ is low at zero volts at this time so transistor 130 is off.

At time $t_2$, $V_{ss}$ goes low, RESET 1 goes low, $G_{dd}$ does high, $V_{dd}$ goes higher than its previous value, $C_{G2}$ goes high, and RESET 2 goes high. When RESET 1 goes low, it turns off transistors 124 and 136 thereby isolating nodes $P_{GA}$ and $P_{GL}$, respectively, from the drain electrodes 132 and 165. When $G_{dd}$ goes high to 2V, this turns on transistor 130 hard. When $V_{dd}$ goes high to about 2V, (a change in voltage of about $\Delta V$) node $P_{GL}$ is raised a corresponding amount ($\Delta V$), placing transistor 128 in conduction. Thus, transistor 128 now serves as a load on amplifier transistor 120. $V_{ss}$ (which is at 0 volts) serves as one operating voltage for the amplifier stage, this voltage being applied to the source electrode of the amplifier. $V_{DD}$ which is at about 2V is the other operating voltage and it is applied to the drain electrode of load resistor 130. In response to these operating voltages $V_{DD}$ and $V_{SS}$, current flows through the inverter amplifier and the voltage at node $P_0$ may increase or decrease slightly from its value during the previous reset period $t_1$-$t_2$. (In FIG. 11, $P_0$ increases slightly by a small increment $\Delta P_0$.) The new voltage level, which is close to V, can be considered to be the quiescent voltage level at the drain electrode of the driver transistor 120. During a later period ($t_5$-$t_6$) that amplification of the column signal (which in the present circuit is a positive going signal) occurs, this voltage $P_0$ will change to a less positive value as discussed shortly.

$G_{IN}$ is high at time $t_2$ so that transistor 116 is on. However, the column 114 is clamped to the reference voltage level +V present at conductor 112 and there is no signal present on this column at this time.

When RESET 2 goes high at time $t_2$, this turns on transistor 142. $C_{G2}$ also is high at about 3/2V so that node $P_{G2}$ initially is placed at this same level conditioning transistor 140 to conduct. This transistor conducts until its gate electrode voltage reduces from the level 3/2V to a value one $V_{th}$ greater than the quiescent voltage $P_0$ at the source electrode of transistor 140. This is illustrated at 168 in FIG. 11 where the voltage level is shown as $P_0+V_{TH2}$, $V_{TH2}$ being the threshold voltage of transistor 140.

During the period $t_3$-$t_4$, the previous row of information, that is, that previously extracted from row N−1, (not shown) is scanned out of the register 107. During this time, $S_d$ goes low to zero volts and $G_{IN}$ is low. Thus, transistor 116 is off disconnecting the column from the read-out circuits. Transistor 110 is on so that the columns are clamped to 0 volts, the voltage on conductor 112. The purpose of reducing the columns to zero volts at this time is to permit the electrons stored under the electrodes 12 of the row just read (N−1) to be discharged by injection into the substrate.

During the next period $t_4$-$t_7$, row N is read from the array. The readout occurs in three steps. During the time $t_4$-$t_5$, row N is made negative to transfer charge from beneath plates 12 to beneath plates 14. $S_d$ is made relatively positive and $G_d$ is relatively positive so that transistor 110 is on and the column conductor is clamped to +V. The electrons therefore transfer to the potential well beneath 14, this being indicated by a reduction in the surface potential $P_{CN}$ as shown at 170 in FIG. 11.

At time $t_5$, row N is made positive again, $G_d$ is made negative to 0 volts, turning off transistor 110 and allowing the column conductor 114 to float. When row N is made positive, electrons travel from the potential well beneath plate 14 to the potential well beneath plate 12. This results in an increase in the potential of the floating column, legended $\Delta V_C$ in FIG. 11, waveform $P_{COL}$. This positive change in potential of the column causes a positive change in the potential at node $P_{GA}$ at the gate electrode 122 of amplifier driver transistor 120. This positive change in potential is the signal to be amplified and it is legended "row N signal" in FIG. 11 at waveform $P_{GA}$. At this time, transistors 129 and 130 both are on and 129 operates as a load on the amplifier transistor 120 so that an amplified signal appears at $P_0$. This is indicated in FIG. 11 by the legend "$\Delta V_C$ amplified" at waveform $P_0$. Note that as the input signal $\Delta V_C$ is positive-going, the amplified output signal at $P_0$ is negative-going. This amplified signal has been compensated for the effects of the threshold voltages of the various transistors by pre-setting the bias voltages at the gate electrodes of these transistors in the manner already discussed.

At time $t_5$, transistor 140 may be on. In this case, the amplified signal at node $P_0$ will also appear at node $P_X$. Alternatively, as shown by dashes, $C_{G2}$ may be at a less positive value to hold transistor 140 off until time $t_6$. In this case, the amplified signal is stored at node $P_0$ until time $t_6$.

At time $t_6$, $V_{ss}$ goes high to V/2, thereby making the source electrode of transistor 133 more positive. $V_{dd}$ goes low to +V thereby making the drain electrode of transistor 130 more negative. This change in the operating voltage across the amplifier stage tends to turn off the amplifier stage. $C_{G2}$ is high so that transistor 140 is on. $G_{OUT}$ now goes high, turning on transistor 144 hard on. $P_1$, which may be considered the surface potential beneath a CCD electrode in outut register 107, initially is at about 2V which is more positive than the voltage at nose $P_0$. Therefore, the amplified charge signal at $P_0$ (electrons) is transmitted via the conduction paths of transistors 140 and 144 to $P_1$ in the output register 107. This output signal is an amplified version of the signal induced on a column conductor and the threshold voltages of the amplifier stage, and the discharge stage, have been compensated for. The same thing that occurs at column 114, of course occurs in the remaining columns, that is, a complete row of amplified signals is transferred at one time from the array to the output register 107.

The remainder of the operation is believed to be self-evident from the figure. After row N has been transferred to output register 107, the multiple phase voltages (not shown) applied to the register causes the serial transfer of the signals stored therein to the output terminal of the register. Concurrently with the scanning of this information from the output register, the charge in row N is injected into the substrate. Thereafter, the complete process described is performed again for eafch succeeding row.

While the various embodiments of the invention have been illustrated in terms of N-channel (P-type substrate) devices, it is of course to be understood that the circuits can be implemented with P-channel (N substrate) devices instead. It is also to be understood that the two-phase operated CCD registers shown are intended as illustrations only. The system is equally operative with three, four or higher phase CCD registers and further, other forms of output structures such as bucket brigade shift registers may be employed instead.

What is claimed is:

1. In combination:
 a field effect transistor having source, drain and gate electrodes, said drain electrode coupled to a circuit point which can be electrically floated;
 means coupled to said source electrode for placing the same at a reference voltage level ($V_c$);
 means ac coupled to said gate electrode for inducing thereon a potential greater than one threshold voltage ($V_{th}$) above $V_c$, in the forward direction;
 means providing a low impedance dc path between said gate and drain electrodes during the time said induced potential is present at said gate electrode and while said drain electrode is electrically floating, whereby charge carriers are conducted through the source-to-drain electrode path of said transistor until the voltage difference between said source and gate electrodes reduces to a value substantially equal to $V_{th}$, whereupon conduction ceases through said source-to-drain electrode path; and
 means for opening said dc path while said voltage difference between said source and gate electrodes is substantially equal to $V_{th}$, whereby a quiescent forward bias $V_{th}$ is established between said source and gate electrodes.

2. The combination as set forth in claim 1, wherein said means ac coupled to said gate electrode comprises:
 a conductor;
 means for changing the potential on said conductor from one dc level to a second dc level; and
 means capacitively coupling said conductor to said gate electrode.

3. The combination as set forth in claim 1, wherein said low impedance path comprises a second field effect transistor having a conduction path and a gate electrode, said conduction path being connected between said gate and drain electrodes, and means for placing said gate electrode at a potential to cause said conduction path to exhibit a relatively low impedance; and
 wherein said means for opening said dc path comprises means for placing said gate electrode of said second field effect transistor at a potential to drive the same to cut-off.

4. The combination as set forth in claim 1, further including:
 means responsive to a control signal for applying charge signal to said gate electrode in a sense to change the quiescent bias between said source and gate electrodes to a new value.

5. The combination as set forth in claim 4, wherein said means responsive to a control signal comprises means for applying an amount of charge signal for reducing the forward bias on said gate electrode relative to said source electrode to a new value $V_{th}-V_P$, where $V_P$ is a voltage indicative of a parameter against which it is desired to discriminate.

6. The combination as set forth in claim 1, wherein said gate electrode is connected to a circuit node, and wherein said field effect transistor is formed in a semiconductor substrate to which said node is capacitively coupled, and further including:
 means coupled to said node, responsive to a parameter against which it is desired to discriminate for adding to said node a charge signal proportional thereto in a sense to reduce the quiescent bias between said source and gate electrodes.

7. In the combination as set forth in claim 1, said field effect transistor comprising a driver transistor of an inverter, and further including:
 a second field-effect transistor serving as the load for said inverter, said second transistor having source, drain and gate electrodes, said second transistor connected at its source electrode to the drain electrode of said driver transistor;
 means for establishing at the gate electrode of said second transistor a voltage which is one threshold voltage ($V_{th2}$) of said second transistor greater in the forward direction that the voltage at its source electrode; and
 means for thereafter connecting the drain electrode of said second transistor to an operating voltage terminal.

8. In the combination as set forth in claim 7, said means for establishing at the gate electrode of said second transistor a voltage which is one $V_{th2}$ greater than its source electrode voltage comprising:
 means ac coupled to the gate electrode of said second transistor for inducing thereon, a potential greater than one $V_{th2}$ above the voltage at its source electrode;
 means providing a low impedance dc path between the gate and drain electrodes of said second transistor while the induced potential is present at its gate electrode, and while its drain electrode is floating; and
 means for opening said dc path between the gate and drain electrodes of said second transistor when conduction therethrough ceases.

9. The combination of:
 a charge transfer array having a plurality of columns;

an output register having at least the same number of stages as there are columns;

a circuit for coupling each column to a different register stage for permitting the transfer, in parallel, of a row of signals from the charge transfer array to the output register, said circuit including a plurality of transistor circuits, one per column, each such circuit comprising:

a field effect transistor having source, drain and gate electrodes;

means coupled to said source electrode for placing the same at a reference voltage level $V_c$;

means connecting the drain and gate electrodes to one another via a low impedance path and for ac coupling a potential to said gate electrode at a level such that current flows through the source-to-drain path of said transistor until a quiescent bias level $V_c + V_{th}$ is established on said gate electrode, whereupon current flow ceases through said transistor, where $V_{th}$ is the threshold voltage of said transistor;

means for then disconnecting said drain electrode from said gate electrode;

means for supplying a signal from a column between said source and gate electrodes of said transistor after said quiescent bias level has been established; and means for connecting said drain electrode to a stage of said register for transferring any signal produced at said drain electrode in response to current flow through said source-to-drain path, to said stage.

10. The combination of claim 9, wherein said charge transfer array comprises a charge-injection device array.

11. The combination of claim 9, wherein said charge transfer array comprises a charge-coupled device array.

12. The combination of claim 9, wherein said output register comprises a charge-coupled device register.

13. The combination as set forth in claim 9, further including:

means for changing the bias level established on said gate electrode from the level $V_c + V_{th}$ to a second level, prior to supplying a signal from said column to said transistor.

14. The combination as set forth in claim 13, wherein said means for changing said bias level comprises:

means responsive to a background signal level present at said column for transferring a charge signal proportional thereto to said gate electrode, after said drain electrode is disconnected from said gate electrode, to thereby change said bias level to a value $V_c + V_{th} - V_{BG}$, where $V_{BG}$ is a voltage proportional to said charge signal.

15. The combination as set forth in claim 13, wherein said means for changing said bias level comprises:

means responsive to a background signal level present at said column after said bias level $V_c + V_{th}$ has been established at said gate electrode and prior to the time said drain electrode is disconnected from said gate electrode, for supplying an amount of current to the source electrode of said transistor proportional to said background signal level in a sense to reduce the voltage at said gate electrode to a value $V_c + V_{th} - V_{BR}$, where $V_{BR}$ is a voltage proportional to said background signal level.

16. The combination as set forth in claim 13, wherein said means for changing said bias level comprises:

means for ac coupling a fixed voltage increment $V_{FZ}$ to said gate electrode after said drain electrode is disconnected from said gate electrode, to thereby change said bias level to a value $V_c + V_{th} - V_{FZ}$, where $V_{FZ}$ represents a so-called "fat zero" voltage level.

17. The combination as set forth in claim 9, wherein said transistor is directly connected at its source electrode to said column.

18. The combination as set forth in claim 9, wherein said means for supplying a signal comprises switch means connected between said column and said source electrode responsive to a control signal for connecting said column to said source electrode.

19. The combination as set forth in claim 9, wherein said source electrode is connected to a terminal for an operating voltage, and wherein said means for supplying a signal comprises means for ac coupling said signal from said column to said gate electrode.

20. The combination as set forth in claim 9, wherein said transistor comprises the driver transistor of an inverter, and further including:

a second field effect transistor, having source, gate and drain electrodes, connected at its source electrode to the drain electrode of said driver transistor and serving as the load therefor; and means for establishing a quiescent voltage $V_S + V_{th2}$ at the gate electrode of said second transistor, where $V_S$ is the voltage at its source electrode and $V_{th2}$ is its threshold voltage.

* * * * *